(12) United States Patent
Lavi et al.

(10) Patent No.: US 6,256,231 B1
(45) Date of Patent: Jul. 3, 2001

(54) EEPROM ARRAY USING 2-BIT NON-VOLATILE MEMORY CELLS AND METHOD OF IMPLEMENTING SAME

(75) Inventors: Yoav Lavi, Raannana; Ishai Nachumovsky, Zichron Yaakov, both of (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/244,529

(22) Filed: Feb. 4, 1999

(51) Int. Cl.[7] .................................................. G11C 16/04
(52) U.S. Cl. ................. 365/185.29; 365/63; 365/185.05; 365/218
(58) Field of Search .................... 365/185.29, 185.05, 365/218, 51, 63

(56) References Cited

U.S. PATENT DOCUMENTS

| | | | |
|---|---|---|---|
| 5,768,192 | 6/1998 | Eitan ............................... | 365/185.24 |
| 5,793,666 * | 8/1998 | Yamazaki ........................ | 365/185.05 |
| 5,844,839 * | 12/1998 | Smayling et al. ............... | 365/185.29 |
| 5,875,128 * | 2/1999 | Ishizuka ........................... | 365/185.05 |
| 5,936,887 * | 8/1999 | Choi et al. ....................... | 365/185.05 |

* cited by examiner

Primary Examiner—Son T. Dinh
(74) Attorney, Agent, or Firm—Bever, Hoffman & Harms, LLP; E. Eric Hoffman

(57) ABSTRACT

A structure and method for implementing an EEPROM using 2-bit non-volatile memory cells. Each memory cell has a first charge trapping region for storing a first bit and a second charge trapping region for storing a second bit. The memory cells are arranged in one or more rows, with a word line coupling the gates of all of the memory cells in each row. Diffusion bit lines couple the first charge trapping region of each memory cell with the second charge trapping region of an adjacent memory cell. When the first charge trapping region of a memory cell is erased, the second charge trapping region of the adjacent memory cell is incidentally erased. This incidental erasure is effectively avoided by: (1) reading the bit stored in the second charge trapping region, (2) writing this bit to a storage device, (3) performing the erase operation, and then (4) restoring the bit from the storage device to the second charge trapping region of the adjacent memory cell. If an erase operation results in the incidental erasure of additional bits (as will occur when more than one row of memory cells is coupled to a single diffusion bit line), then all of the bits that would be incidentally erased are written to the storage device before the erase operation, and are restored to the array after the erase operation. The incidental erasure can also be rendered moot by using only one charge trapping region of each memory cell.

14 Claims, 8 Drawing Sheets

EEPROM ARRAY USING 2-BIT NON-VOLATILE MEMORY CELLS AND METHOD OF IMPLEMENTING SAME

FIELD OF THE INVENTION

The present invention relates to non-volatile memory cells. More specifically, the present invention relates to a method and structure of using a 2-bit flash memory cell to form an electrically erasable programmable read only memory (EEPROM) array.

RELATED ART

FIG. 1 is a cross sectional view of a conventional 1-bit non-volatile semiconductor memory cell 10 that utilizes asymmetrical charge trapping. 1-bit memory cell 10, which is fabricated in p-type substrate 12, includes n+ source region 14, n+ drain region 16, channel region 17, silicon oxide layer 18, silicon nitride layer 20, silicon oxide layer 22, and control gate 24. Oxide layer 18, nitride layer 20 and oxide layer 22 are collectively referred to as ONO layer 21. Memory cell 10 operates as follows. A programming operation is performed by connecting source region 14 to ground, connecting drain region 16 to a programming voltage of about 9 Volts, and connecting control gate 24 to a voltage of about 10 Volts. As a result, electrons are accelerated from source region 14 to drain region 16. Near drain region 16, some electrons gain sufficient energy to pass through oxide layer 18 and be trapped in nitride layer 20 in accordance with a phenomenon known as hot electron injection. Because nitride layer 20 is non-conductive, the injected charge remains localized within charge trapping region 26 in nitride layer 20.

Memory cell 10 is read by applying 0 Volts to the drain region 16, 2 Volts to the source region 14, and 3 volts to the gate electrode. If charge is stored in charge trapping region 26 (i.e., memory cell 10 is programmed), then memory cell does not conduct current under these conditions. If there is no charge stored in charge trapping region 26 (i.e., memory cell 10 is erased), then memory cell 10 conducts current under these conditions. The current, or lack of current, is sensed by a sense amplifier to determine the state of memory cell 10.

Note that the polarity of the voltage applied across source region 14 and drain region 16 is reversed during the program and read operations. That is, memory cell 10 is programmed in one direction (with source region 14 grounded), and read the opposite direction (with drain region 16 grounded). As a result, the read operation is referred to as a reverse read operation. Memory cell 10 is described in more detail in U.S. Pat. No. 5,768,192.

Memory cell 10 can also be controlled to operate as a 2-bit non-volatile semiconductor memory cell. To accomplish this, memory cell 10 is controlled to use a second charge trapping region in nitride layer 20, which is located adjacent to source region 14. FIG. 2 illustrates both the first charge trapping region 26 (described above in connection with FIG. 1), and the second charge trapping region 28 in dashed lines. The second charge trapping region 28 is used to store a charge representative of a second bit. The second charge trapping region 28 is programmed and read in a manner similar to the first charge trapping region 26. More specifically, the second charge trapping region 28 is programmed and read by exchanging the source and drain voltages described above for programming and reading the first charge trapping region 26. Thus, the second charge trapping region 28 is programmed by applying 0 Volts to drain region 16, applying 9 Volts to source region 14 and applying 10 Volts to control gate 24. Similarly, the second charge trapping region 28 is read by applying 0 Volts to source region 14, 2 Volts to drain region 16, and 3 Volts to control gate 24.

Note that because nitride layer 20 is non-conductive, the charges stored in the first and second charge trapping regions 26 and 28 remain localized within nitride layer 20. Also note that the state of the first charge trapping region 26 does not interfere with the reading of the charge stored in the second charge trapping region 28 (and vice versa). Thus, if the first charge trapping region 26 is programmed (i.e., stores charge) and the second charge trapping region 28 is not programmed (i.e., does not store charge), then a reverse read of the first charge trapping region will not result in significant current flow. However, a reverse read of the second bit will result in significant current flow because the high voltage applied to drain region 16 will result in unperturbed electronic transfer in the pinch off region adjacent to first charge trapping region 26. Thus, the information stored in the first and second charge trapping regions 26 and 28 is read properly.

Similarly, if both the first and second charge trapping regions are programmed, a read operation in either direction will result in no significant current flow. Finally, if neither the first charge trapping region 26 nor the second charge trapping region 28 is programmed, then read operations in both directions will result in significant current flow.

Because the 1-bit and 2-bit implementations of memory cell 10 are relatively new, the manner of using this memory cell 10 in a memory cell array has not yet been fully developed. It would therefore be desirable to have a memory array structure that allows memory cell 10 to be implemented as an electrically erasable programmable read only memory (EEPROM). For purposes of this disclosure, an EEPROM array is defined as a non-volatile memory array that can be erased on a word-by-word basis. This is in contrast to a flash memory array, which is defined as a non-volatile memory array that cannot be erased on a word-by-word basis, but which must be erased in blocks. It would further be desirable if the EEPROM array architectures could be fabricated using a standard flash process.

SUMMARY

Accordingly, the present invention provides structures and methods for implementing an EEPROM array using 2-bit non-volatile memory cells. As described above, each memory cell has a first charge trapping region for storing a first bit and a second charge trapping region for storing a second bit.

In one embodiment, the EEPROM array includes an array of 2-bit memory cells arranged in a plurality of rows and columns. Each row of memory cells shares a word line, which provides a common connection to the control gates of the memory cells in the row. Also within each row, the first charge trapping region of each memory cell is coupled to the second charge trapping region of an adjacent memory cell by a diffusion bit line. Note that for purposes of the present disclosure, a charge trapping region is defined as being "coupled" to its nearest diffusion bit line, even though there is no physical connection between the diffusion bit line and the charge trapping region. In this embodiment, each diffusion bit line provides connections to memory cells in a plurality of rows.

In one embodiment, an erase operation is performed by applying a voltage of about 0 Volts to the word line of the selected memory cell, and a voltage of about 8 Volts to the diffusion bit line of the selected memory cell. Other voltages can be used in other embodiments. Because adjacent memory cells share the same word line and the same diffusion bit line, erasing the first charge trapping region of a memory cell will incidentally erase the second charge trapping region of the adjacent memory cell. Moreover, memory cells in other rows that are coupled to the same diffusion bit line will also receive the erase voltage of 8 Volts, potentially subjecting these memory cells to erase conditions.

The present invention compensates for the above-described erase conditions as follows. A storage device is coupled to the diffusion bit lines of the array. A memory control circuit is coupled to control the EEPROM array and the storage device. Prior to erasing the first charge trapping region of a first memory cell, the memory control circuit reads a plurality of bits from the array, and causes these bits to be written to the storage device. The bits read from the array are selected to include all bits that will be incidentally erased when the first charge trapping region is erased (e.g., the bit stored in the second charge trapping region of the memory cell adjacent to the first memory cell and the other bits sharing the same diffusion bit line). After these bits are stored in the storage device, the memory control circuit causes the first charge trapping region to be erased. After the erase operation is completed, the memory control circuit causes all of the bits in the storage device to be restored to the array. The net effect of these operations is to erase only the first charge trapping region of the first transistor. Because the array can be erased on a word-by-word basis in this manner, the array advantageously operates as an EEPROM array.

In another embodiment of the present invention, each row of memory cells is accessed through a dedicated set of select transistors, and the memory cells in each row have dedicated diffusion bit lines. That is, the diffusion bit lines do not extend to a plurality of rows. As a result, erasing the first charge trapping region of a first transistor only results in the incidental erasing of the second charge trapping region of an adjacent second transistor. Thus, in one variation of this embodiment, the bit stored in the second charge trapping region is written to the storage device, the first charge trapping region is erased, and the bit from the second charge trapping region is restored from the memory storage device to the second charge trapping region of the adjacent second transistor. Again, because this array can be erased on a word-by-word basis, this array advantageously operates as an EEPROM array.

In another variation of this embodiment, the second charge trapping region of the adjacent second transistor is simply not used to store data. As a result, an erase operation only erases one meaningful bit (i.e., the bit stored in the first charge trapping region of the first transistor). Because this array can be erased on a word-by-word basis, this array advantageously operates as an EEPROM array.

The present invention will be more fully understood in view of the following description and drawings.

DETAILED DESCRIPTION

Figure 1:
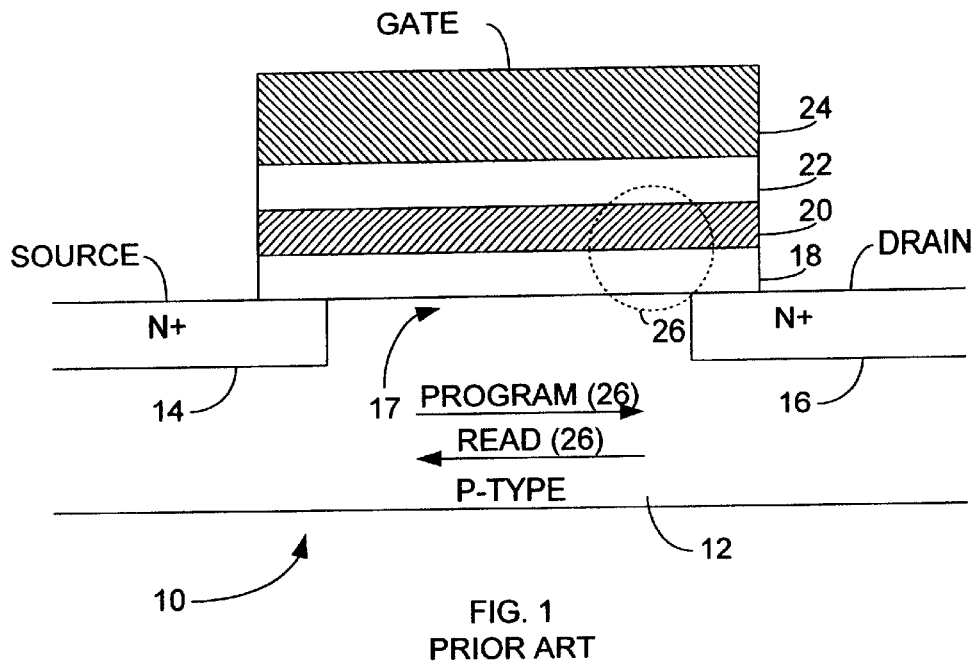
FIG. 1 is a cross sectional diagram illustrating a conventional 1-bit non-volatile memory cell.
Figure 2:
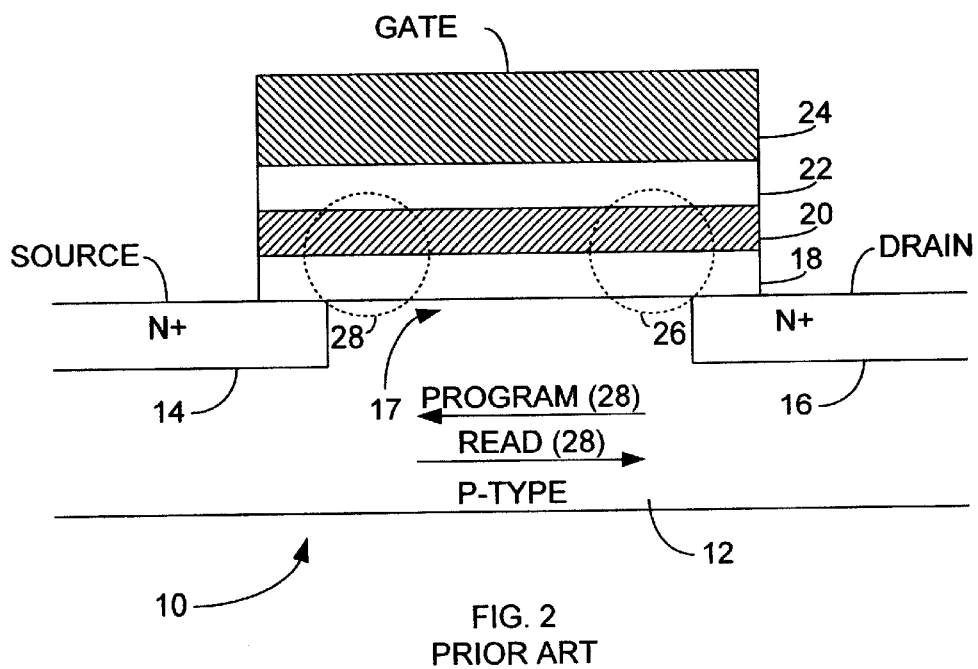
FIG. 2 is a cross sectional diagram illustrating a conventional 2-bit non-volatile memory cell.
Figure 3:
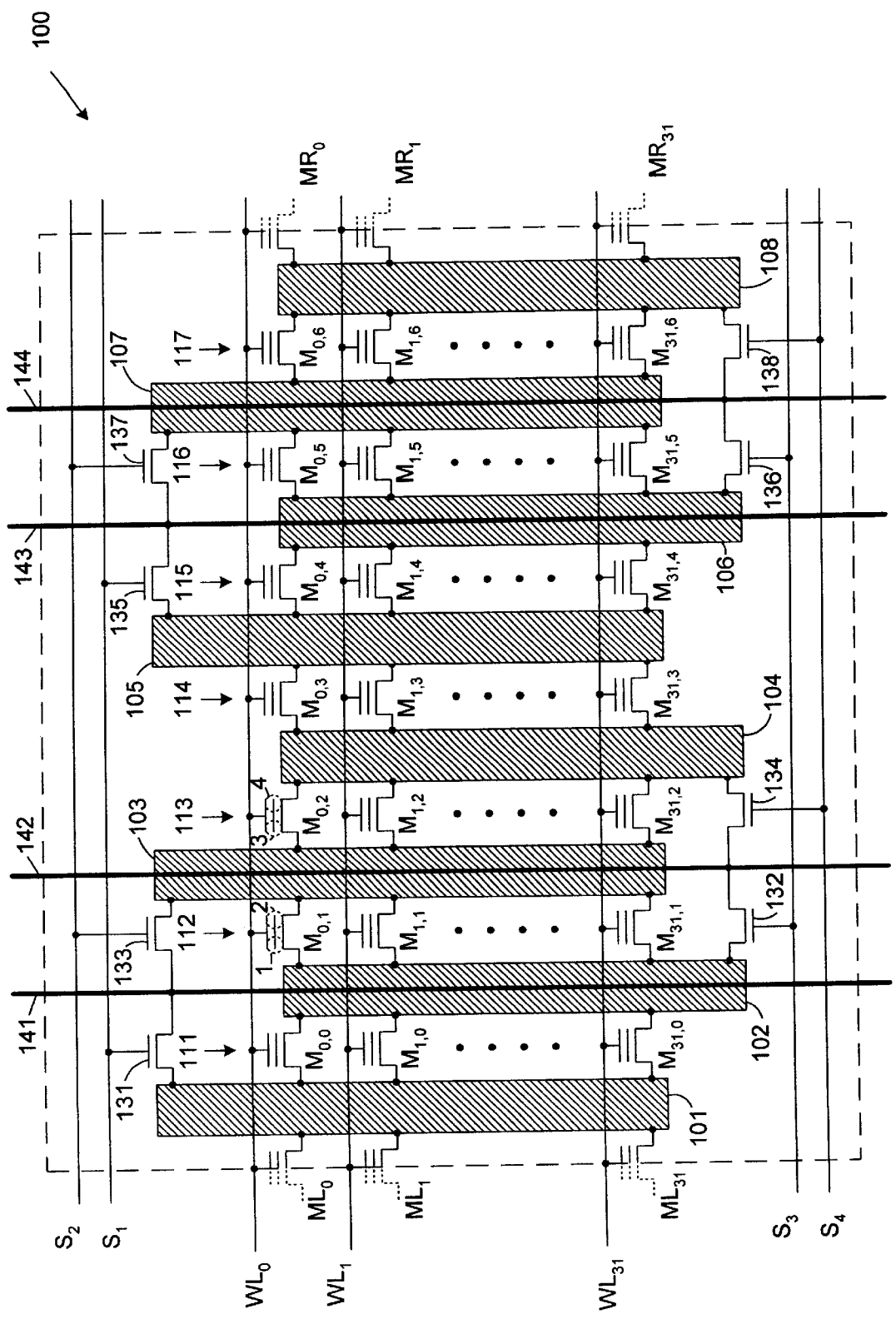
FIG. 3 is a schematic diagram illustrating a memory block that uses the 2-bit memory cells of FIG. 2.

FIG. 3 is a schematic diagram illustrating a memory block 100 in accordance with one embodiment of the present invention. Memory block 100 uses a plurality of 2-bit memory cells identical to 2-bit memory cell 10 (FIG. 2). Memory block 100 includes seven full columns of memory cells, two columns of memory cells that are shared with adjacent memory blocks, and thirty-two rows of memory cells. The rows extend along a first axis, and the columns extend along a second axis, perpendicular to the first axis. The memory cells in the seven full columns are identified as memory cells $M_{x,y}$, where X and Y represent the row and column locations, respectively, of the memory cells within memory block 100. The shared memory cells on the left border of memory block 100 are identified as memory cells $ML_x$, and the shared memory cells on the right border of memory block 100 are identified as memory cells $MR_x$. Thus, memory block includes memory cells $M_{0,0}$–$M_{31,6}$ and shared memory cells $ML_0$–$ML_{31}$ and $MR_0$–$MR_{31}$.

Each of the memory cells includes two charge trapping regions, namely, a left charge trapping region and a right charge trapping region. The charge trapping regions of memory cell $M_{0,1}$, are labeled as left charge trapping region 1 and right charge trapping region 2. Similarly, the charge trapping regions of memory cell $M_{0,2}$ are labeled as left charge trapping region 3 and right charge trapping region 4.

The source and drain regions of memory cells $M_{0,0}$–$M_{31,6}$ are formed by diffused regions 101–108, which extend in parallel along the second axis. As described in more detail below, diffused regions 101–108 also operate as bit lines within memory block 100. Consequently, diffused regions 101–108 are hereinafter referred to as diffusion bit lines.

ONO structures 111–117 are located between adjacent diffusion bit lines 101–108. For example, ONO structure 111 is located between diffusion bit lines 101 and 102. The gates of the memory cells in each row are commonly connected to a word line. More specifically, the memory cells of rows 0–31 are connected to word lines $WL_0$–$WL_{31}$, respectively.

Figure 4A:
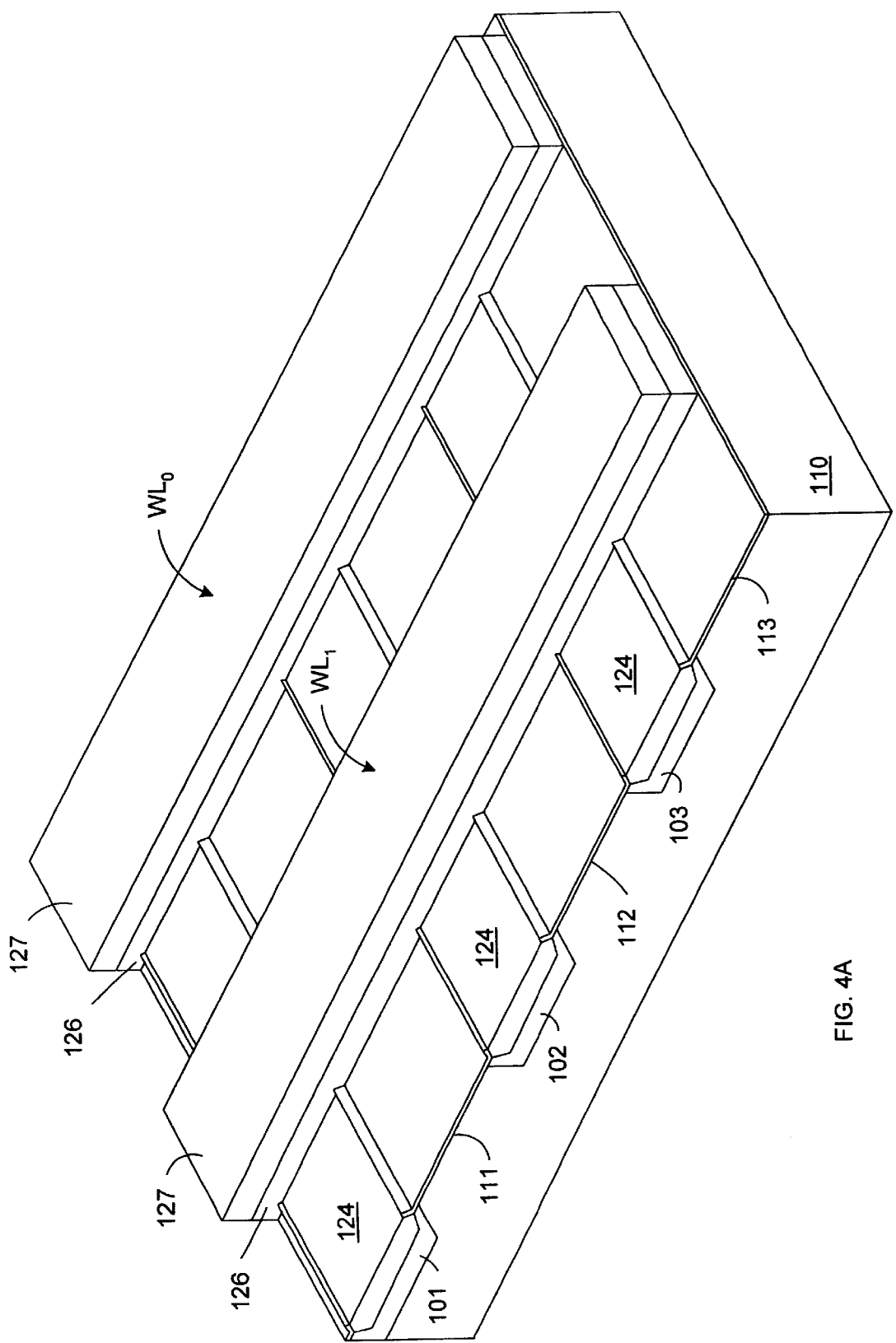
FIG. 4A is an isometric view of memory cells of the memory block of FIG. 3.
Figure 4B:
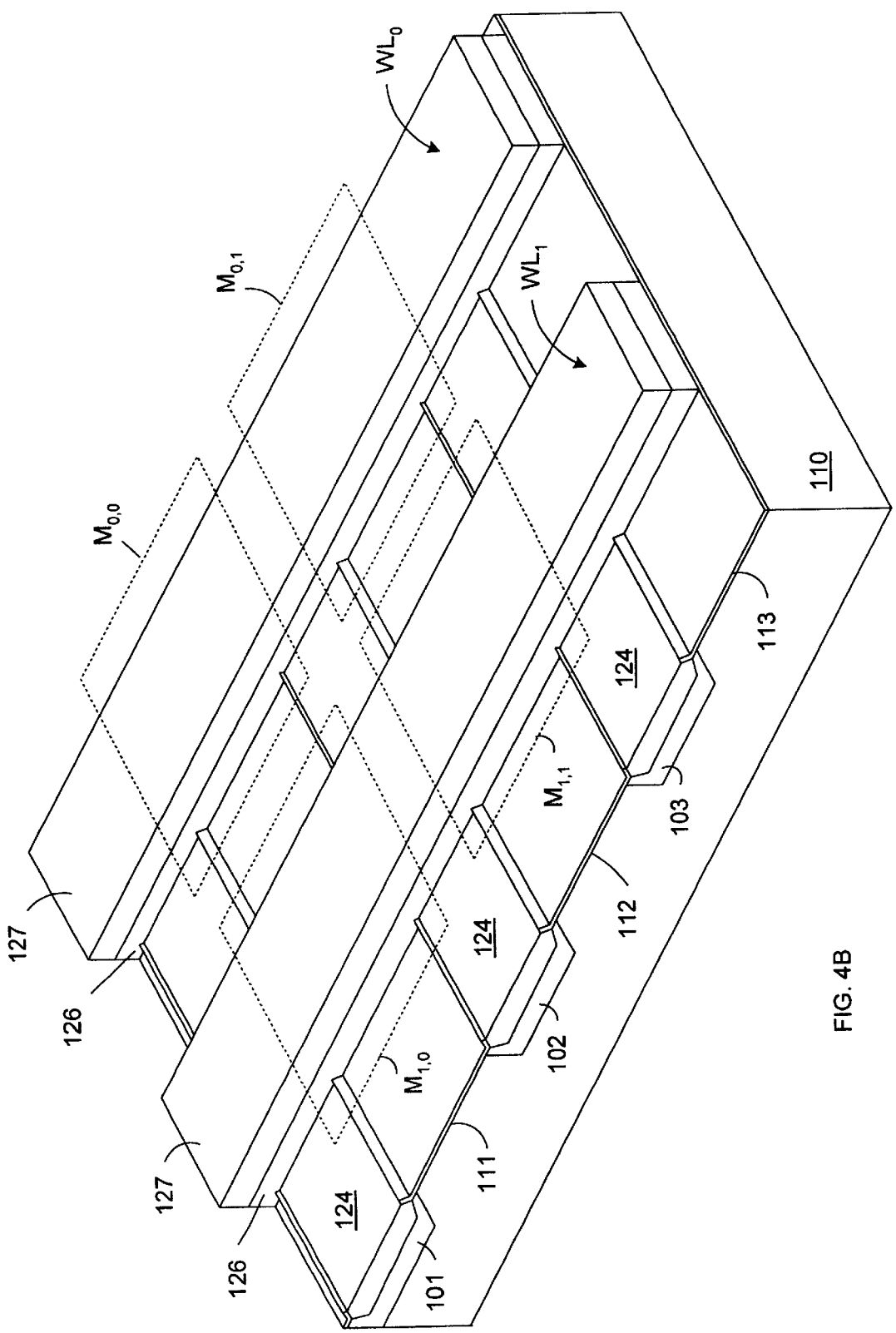
FIG. 4B illustrates the same isometric view as FIG. 4A, with the locations of the memory cells highlighted in dashed lines.
Figure 5:
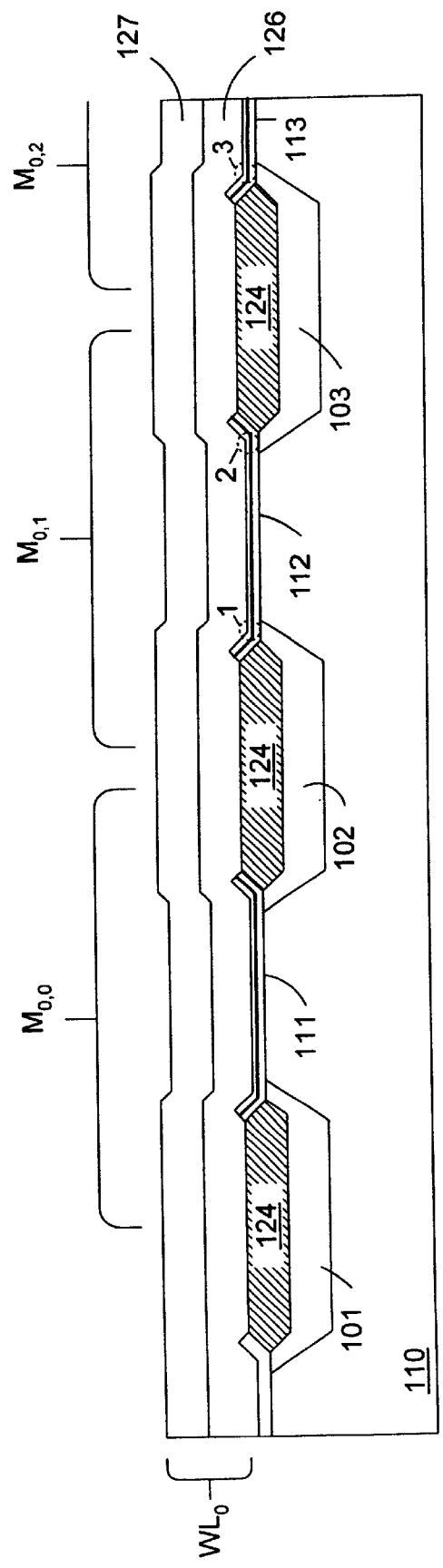
FIG. 5 is a cross sectional view of selected memory cells of FIG. 4A, taken along a word line.

FIG. 4A is an isometric view of memory cells $M_{0,0}$, $M_{0,1}$ $M_{1,0}$, and $M_{1,1}$. FIG. 4B illustrates the same isometric view as FIG. 4A, with the locations of memory cells $M_{0,0}$, $M_{0,1}$, $M_{1,0}$, and $M_{1,1}$, highlighted in dashed lines. FIG. 5 is a cross sectional view of memory cells $M_{0,0}$ and $M_{0,1}$, along the first axis through word line $WL_0$. Diffusion bit lines 101–103 are n-type regions formed in a p-type silicon semiconductor substrate 110. Diffusion bit lines 101–103 can also be formed in a p-well region. Bit line insulating regions 124 are formed over the diffusion bit lines 101–103. Bit line insulating regions 124 can be, for example, silicon oxide having a thickness of approximately 600 Å. Note that bit line insulating regions 124 are an order of magnitude thinner than conventional field oxide. Because the memory cells in memory block 100 do not require field oxide for isolation, memory block 100 can be referred to as a fieldless array. ONO structures 111 and 112 extend over bit line insulating regions 124, diffusion bit lines 101–103 and substrate 110 in the manner illustrated. Word lines $WL_0$ and $WL_1$, which are polycide or salicide structures that include a layer of conductively doped polycrystalline silicon 126 and an overlying layer of metal silicide 127, extend over ONO structures 111 and 112 (and bit line insulating regions 124). Word lines $WL_0$ and $WL_1$ form the control gates of memory cells $M_{0,0}$, $M_{0,1} M_{1,0}$, and $M_{1,1}$. The above-described structures of memory block 100 are fabricated using flash processing steps. The fabrication of memory block 100 is described in more detail in commonly owned, co-filed U.S. patent application Ser. No. xx/xxx,xxx, entitled "METHODS FOR FABRICATING A SEMICONDUCTOR CHIP HAVING CMOS DEVICES AND A FIELDLESS ARRAY" by Efraim Aloni, which is hereby incorporated by reference.

Returning now to FIG. 3, the 2-bit memory cells of memory block 100 are accessed through high-voltage select transistors 131–138 and metal bit lines 141–144. Metal bit lines 141–144 are located in an interconnect layer that extends over the above-described elements of memory block 100. High-voltage select transistors 131–138 are designed to have gate oxide sufficient to withstand the high voltages required for programming and erasing the memory cells. In general, select transistors 131–138 are controlled to selectively connect metal bit lines 141–144 to diffusion bit lines 101–108. The first power terminals of select transistors 131–138 are coupled to diffusion bit lines 101–108, respectively. The second power terminals of select transistors 131 and 133 are coupled to metal bit line 141. The second power terminals of select transistors 132 and 134 are coupled to metal bit line 142. The second power terminals of select transistors 135 and 137 are coupled to metal bit line 143. The second power terminals of select transistors 136 and 138 are coupled to metal bit line 144. The gates of select transistors 131 and 135 are commonly connected to a first select line $S_1$, while the gates of select transistors 133 and 137 are commonly connected to a second select line $S_2$. Similarly, the gates of select transistors 132 and 136 are commonly connected to a third select line $S_3$, while the gates of select transistors 134 and 138 are commonly connected to a fourth select line $S_4$.

The memory cells in memory block 100 are accessed as follows. Two of the select lines $S_1$–$S_4$ are pulled high, thereby turning on the select transistors coupled to these two select lines, and two of the select lines $S_1$–$S_4$ are pulled low, thereby turning off the select transistors coupled to these two select lines. The turned on select transistors couple two columns of memory cells to the metal bit lines 141–144.

For example, when select lines $S_2$ and $S_3$ are pulled high, and select lines $S_1$, and $S_4$ are pulled low, metal bit lines 141–142 are coupled to access the second column of memory cells, and metal bit lines 143–144 are coupled to access the seventh column of memory cells. More specifically, the logic high select lines $S_2$ and $S_3$ cause select transistors 132, 133, 136 and 137 to turn on, and the logic low select lines $S_1$, and $S_4$ cause select transistors 131, 134, 135 and 138 to turn off. Consequently, diffusion bit line 102 is coupled to metal bit line 142 and diffusion bit line 103 is coupled to metal bit line 141. Similarly, diffusion bit line 106 is coupled to metal bit line 144 and diffusion bit line 107 is coupled to metal bit line 143. As a result, signals provided on metal bit lines 141 and 142 are provided to control the memory cells in the second column of memory block 100, and signals provided on metal bit lines 143 and 144 are provided to control the memory cells in the seventh column of memory block 100.

A plurality of memory blocks, identical to memory block 100 can be coupled together along the first and second axes, thereby forming a larger memory array. Shared memory cells are formed at the interfaces between memory blocks along the first axis. More specifically, the right-most shared memory cells $MR_0$–$MR_{31}$ of one memory block combine with the left-most shared memory cells $ML_0$–$ML_{31}$ of an adjacent memory block to form another column of memory cells. Stated another way, the right-most diffusion bit line of one memory block combines with the left-most diffusion bit line of an adjacent memory block (along with the ONO layer located there between) to form a shared column of memory cells. This shared column of memory cells is accessed by the right-most metal line in a memory block and the left-most metal bit line in the right-adjacent memory block. This shared column of memory cells is accessed when select lines $S_1$ and $S_4$ are pulled high and select lines $S_2$ and $S_3$ are pulled low. Note that under these conditions, access is provided to the following memory cells in memory block 100: shared memory cells $ML_0$–$ML_{31}$, shared memory cells $MR_0$–$MR_3$, and the fourth column of memory cells $M_{0,3}$–$M_{31,3}$. Because each column of shared memory cells counts as a half column within memory block 100, there are effectively two accessed columns within memory block 100 under these conditions.

In accordance with one embodiment of the present invention, a memory array is formed by coupling 64 memory blocks identical to memory block 100 along the first axis. This memory array can have any number of memory blocks connected along the second axis. Because each memory block has four metal bit lines, the resulting memory array has a 256 metal bit lines associated with these 64 memory blocks. In this memory array, an additional diffusion bit line, metal bit line and select transistor must be added to the left side of each of the left-most memory blocks of the array. This enables the shared memory cells $ML_0$–$ML_{31}$ of the left-most memory blocks to be accessed. Similarly, an additional diffusion bit line, metal bit line, and select transistor must be added to the right side of each of the right-most memory blocks of the array, thereby enabling the shared memory cells $MR_0$–$MR_{31}$ of the right-most memory blocks to be accessed.

Figure 6:
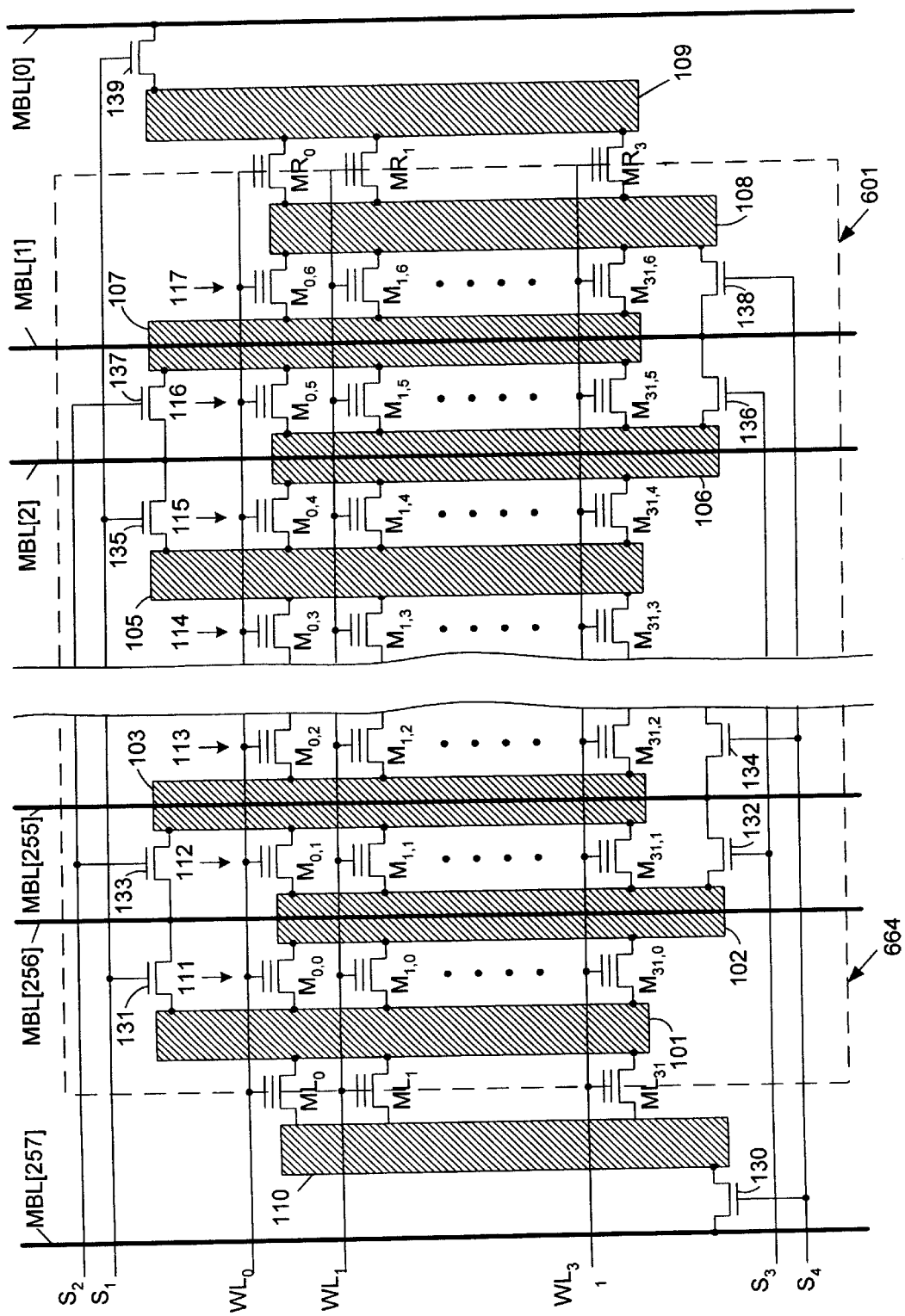
FIG. 6 is a schematic diagram illustrating additional diffusion bit lines, metal bit lines and select transistors connected at the left and right ends of a memory array in accordance with one embodiment of the present invention.

FIG. 6 is a schematic diagram illustrating the additional diffusion bit lines, metal bit lines and select transistors that are connected at the left and right edges of the memory array. In FIG. 6, only the left-most portion of a left-most memory block 664 and the right-most portion of a right-most memory block 601 are illustrated (i.e., memory blocks 602–663, which are located between memory blocks 601 and 664, are not illustrated). Because the left-most memory block 664 and the right-most memory block 601 are identical to memory block 100, the illustrated elements of memory blocks 664 and 601 are labeled with the same reference numbers as memory block 100. However, the metal bit lines are labeled as MBL[N] in FIG. 6, where N is an integer that identifies the metal bit line in the array. Thus, the right-most metal bit lines in memory block 601 are labeled MBL[2] and MBL[1]. Similarly, the left-most metal bit lines in memory block 664 are labeled as MBL[256] and MBL[255]. The 256 metal bit lines in the 64 memory blocks coupled along the first axis are therefore identified as metal bit lines MBL[256:1].

Diffusion bit line 110, metal bit line MBL[257] and select transistor 130 are located at the left edge of the array. Memory cells $ML_0$–$ML_{31}$ are formed between diffusion bit line 110 and diffusion bit line 101 of memory block 664. Select transistor 130 is connected between diffusion bit line 110 and metal bit line MBL[257]. The gate of select transistor 130 is coupled to select line $S_4$.

Similarly, diffusion bit line 109, metal bit line MBL[0] and select transistor 139 are located at the right edge of the array. Memory cells $MR_0$–$MR_{31}$ are formed between diffusion bit line 109 and diffusion bit line 108 of memory block 601. Select transistor 139 is connected between diffusion bit line 109 and metal bit line MBL[0]. The gate of select transistor 139 is coupled to select line $S_1$.

Because of the two additional metal bit lines MBL[257] and MBL[0] provided at the left and right edges of the memory array, the memory array has a total of 258 metal bit lines (i.e., MBL[257:0]).

Access having been provided to all of the memory cells, program, read and erase operations are performed as follows.

Read Operation

A single bit of memory block 100 is read as follows. The word line associated with the selected memory cell is maintained at a read voltage of 3 volts, while the word lines associated with the non-selected memory cells are held at a voltage of 0 Volts. One of the diffusion bit lines of the selected memory cell is held at a voltage of 2 Volts, and the other diffusion bit line of the selected memory cell is coupled to a sense amplifier (and held at a voltage of about 0 Volts), such that a reverse read conditions exist for the selected memory cell. For example, to read the right charge trapping region 2 of memory cell $M_0$, the word line $WL_0$ is held at a voltage of 3 Volts, while the word lines $WL_1$–$WL_{31}$, are held at 0 Volts. A voltage of 2 Volts is applied to diffusion bit line 102, and diffusion bit line 103 is coupled to a sense amplifier (0 Volts), thereby creating reverse read conditions for right charge trapping region 2 of memory cell $M_{0,1}$. Under these conditions, the non-selected memory cells are neither read nor disturbed.

Program Operation

For a programming operation, the word line associated with the selected memory cell is held at a programming voltage of 11 volts, while the word lines associated with the non-selected memory cells are held at a voltage of 0 Volts. The source region of the selected memory cell is maintained at a voltage of 0 Volts, and the drain region of the selected memory cell is maintained at a voltage of 5.5 Volts. For example, to program the right charge trapping region 2 of memory cell $M_{0,1}$, the word line $WL_0$ is held at a voltage of 11 Volts, while the word lines $WL_1$–$WL_{31}$ are held at 0 Volts. A voltage of 5.5 Volts is applied to diffusion bit line 103, and a voltage of 0 Volts is applied to diffusion bit line 102, thereby creating a program condition for right charge trapping region 2 of memory cell $M_{0,1}$. The duration of the programming operation is on the order of micro-seconds. Note that the duration of the programming operation is not long enough and the applied drain voltage of 5.5 Volts is not high enough to cause the non-selected memory cells to be erased during the programming operation.

Erase Operation

An erase operation is performed by applying 0 Volts to the gate of a selected memory cell and 8 Volts to the drain region of the selected memory cell. In general, erase operations in memory block 100 cannot be limited to a single memory cell. For example, an attempt to erase the right charge trapping region 2 of memory cell $M_{0,1}$ would proceed as follows. First, the select transistors 132 and 133 are turned on, thereby providing access to the second column of memory block 100 by coupling metal bit lines 141 and 142 to diffusion bit lines 103 and 102, respectively. An erase voltage of 8 Volts is applied to diffusion bit line 103, and an erase voltage of 0 Volts is applied to word line $WL_0$.

Under these conditions, the right charge trapping region 2 of memory cell $M_{0,1}$ is erased. However, under these conditions, the left charge trapping region 3 of the adjacent memory cell $M_{0,2}$ is also erased. Moreover, if the non-selected word lines $WL_1$–$WL_{31}$, are maintained at 0 Volts, then the right charge trapping regions of all of the memory cells in the second column and the left charge trapping regions of all of the memory cells in the third column are also erased. As a result, the erase operation will erase a minimum of 64 bits. Raising the voltages on the non-selected word lines may eliminate the erase conditions, but may, in turn, create undesirable programming conditions.

Because a normal erase operation will erase at least 64 bits, one erase option is to erase the entire memory block 100 at the same time, thereby operating memory block 100 as a flash memory. To erase the entire memory block 100, all of the word lines $WL_0$–$WL_{31}$ are held at 0 Volts, and all of the diffusion bit lines 101–108 are held at a voltage of 8 Volts. The duration of the erase operation is on the order of milli-seconds.

As described above, a normal erase operation in memory block 100 will erase at least 64 bits. However, to operate memory block 100 as an EEPROM, there must be a mechanism for erasing data on a word-by-word basis. It would therefore be desirable to modify the erase operation of memory block 100, such that memory block 100 can be erased on a word-by-word basis. In one embodiment of the present invention, the method of operating memory block 100 is modified such that memory block 100 emulates EEPROM. To accomplish this emulation, a single bit of memory block 100 is erased in the following manner.

Figure 7:
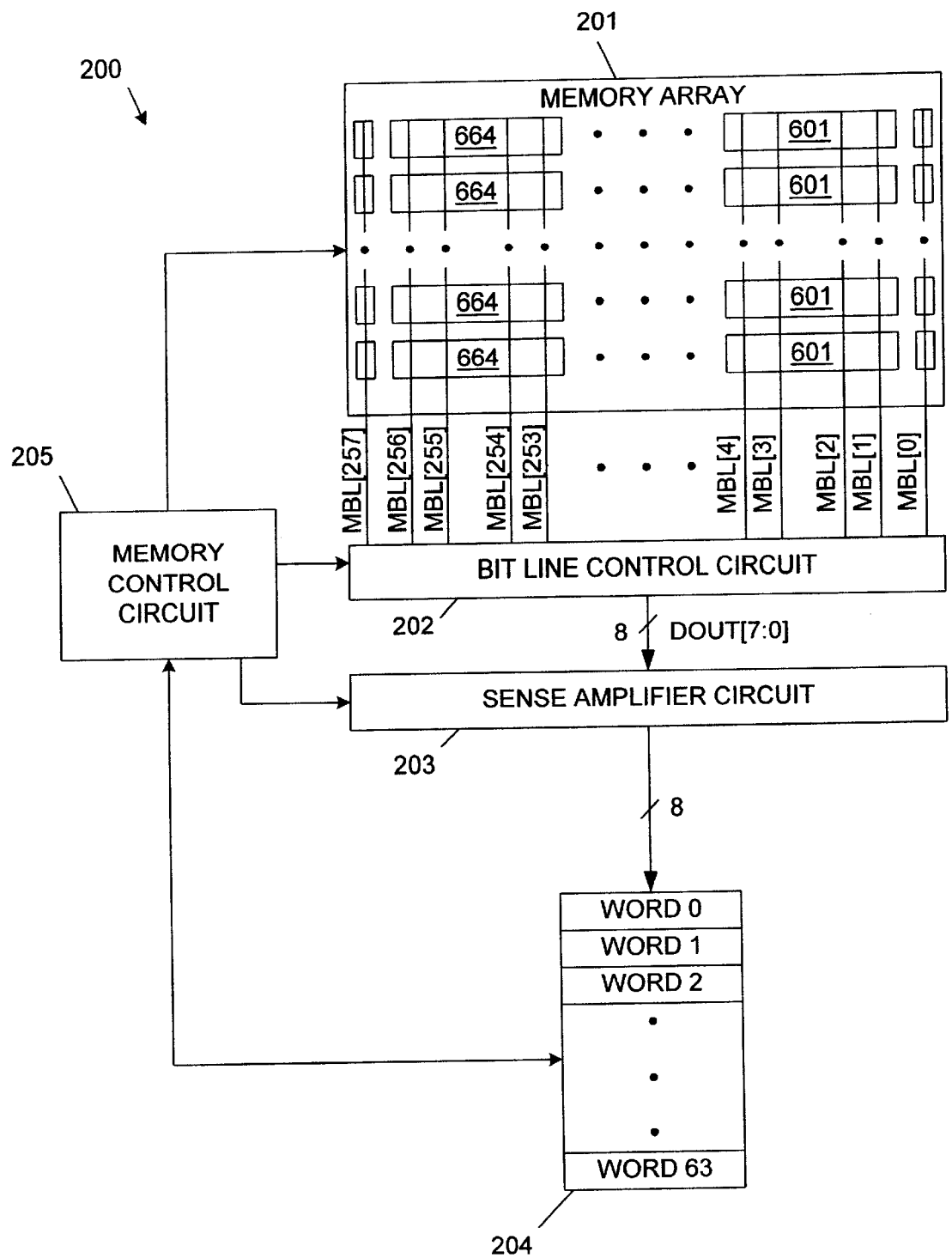
FIG. 7 is a block diagram of a circuit that emulates per bit erasing of the memory block of FIG. 3 in accordance with one embodiment of the present invention.

FIG. 7 is a block diagram of an erase emulation structure 200 that emulates word-by-word erasing in a memory array that uses memory block 100. Emulation structure 200 includes memory array 201, bit line control circuit 202, sense amplifier circuit 203, 64 word storage device 204 and memory control circuit 205. Memory array 201 is formed from a plurality of memory blocks identical to memory block 100. The metal bit lines of memory array 201 are routed to bit line control circuit 202. Bit line control circuit 202 is controlled to apply the appropriate read, program and erase voltages to the metal bit lines MBL[257:0]. During a read operation, bit line control circuit 202 also routes an addressed set of eight bit lines to sense amplifier circuit 203 in response to a column address received from memory control circuit 205. Bit line control circuit 202 is described in more detail in commonly owned, co-filed U.S. patent application Ser. No. xx/xxx,xxx, by Oleg Dadashev, entitled BIT LINE CONTROL CIRCUIT FOR A MEMORY ARRAY USING 2-BIT NON-VOLATILE MEMORY CELLS, which is hereby incorporated by reference.

The number of bit lines routed to sense amplifier circuit 203 is selected to correspond with the word width of memory array 201. In the described example, this word width is 8 bits. Note that each bit of the 8-bit word routed to sense amplifier circuit 203 is received from a different memory block within memory array 201. Sense amplifier circuit 203 is coupled to storage device 204. Storage device 204 is configured to store 64 8-bit values. Memory control circuit 205 provides address signals to control the access of storage device 204. Storage device 204 can be, for example, a static random access memory (SRAM).

The operation of erase emulation circuit 200 will now be described in connection with an example. This example describes the process required to erase one bit in a memory block within memory array 201. However, it is understood that this process is simultaneously performed for 8 bits in 8 different memory blocks, such that an entire word is erased. The present example assumes that it is desired to erase the bit stored in the right charge trapping region 2 of memory cell $M_{0,1}$, (FIG. 3).

First, memory control circuit 205 controls memory array 201 and bit line control circuit 202 such that the bit stored in the right charge trapping region of memory cell $M_{0,1}$ is read. Memory control circuit 205 further controls bit line control circuit 202 to route this bit (along with the seven other addressed bits of the word) to sense amplifier circuit 203 and storage device 204. Memory control circuit 205 causes the accessed bit (word) to be written to the first entry of storage device 204.

Memory control circuit 205 then sequentially performs read accesses of the right charge trapping regions of memory cells $M_{1,1}$–$M_{31,1}$. That is, memory control circuit 205 sequentially reads the bits from the right charge trapping regions of all of the memory cells in the second column. The bits read are stored in sequential locations in storage device 204 under the control of memory control circuit 205.

Memory control circuit 205 then sequentially performs read accesses of the bits stored in the left charge trapping regions of memory cells $M_{0,2}$–$M_{31,2}$. That is, memory control circuit 205 causes the bits from the left charge trapping regions of all of the memory cells in the third column to be sequentially read. These bits are stored in sequential locations in storage device 204 under the control of memory control circuit 205.

After these 64 read operations have been completed, all of the bits that would have been erased by erasing the right charge trapping region 2 of memory cell $M_{0,1}$ are stored in storage device 204. At this time, memory control circuit 205 performs an erase operation that erases the right charge trapping region 2 of memory cell $M_{0,1}$. As described above, this erase operation also erases the right charge trapping regions of memory cells $M_{1,1}$–$M_{31,1}$ and the left charge trapping regions of memory cells $M_{0,2}$–$M_{31,2}$.

After the erase operation has been completed, memory control circuit 205 performs 63 consecutive programming operations to restore the bits from storage device 204 to the right charge trapping regions of memory cells $M_{1,1}$–$M_{31,1}$ and the left charge trapping regions of memory cells $M_{0,2}$–$M_{31,2}$. That is, the bits are restored to the left charge trapping regions of all of the memory cells in the third column, and to the right charge trapping regions of all of the memory cells in the second column, except for the right charge trapping region of memory cell $M_{0,1}$. The net effect of these operations is to erase only the bit stored in the right charge trapping region of memory cell $M_{0,1}$. In the foregoing manner, memory array 201 can be erased on a word-by-word basis, thereby enabling memory array 201 to be operated as an EEPROM array. Note that a bit stored in the left charge trapping region of a memory cell can be erased in a similar manner.

The time required to read the 64 bits from memory array 201 is on the order of nano-seconds. The time required to perform the erase operation is on the order of tens of milli-seconds. The time required to re-program each of the 63 bits back into memory array 201 is on the order of micro-seconds. Consequently, the time required to read and restore the 63 bits that are not being erased is a small percentage (i.e., about 1 percent) of the total erase time.

In a variation of the above-described embodiment, memory controller 205 does not cause the bit to be erased to be read and stored in storage device 204. In the above described example, the bit stored in the right charge trapping region of the memory cell $M_{0,1}$ would not be read (since this bit is going to be subsequently erased). As a result, only 63 read operations are performed prior to the erase operation.

It is understood that the endurance of memory array 201 may be limited in the present embodiment, because on average, the memory cells of memory array 201 will be erased and programmed approximately 63 times more often than memory cells in an equivalent flash memory. However, it is understood that this loss of endurance is acceptable in certain applications where memory array 201 is not expected to be re-programmed a large number of times.

Figure 8:
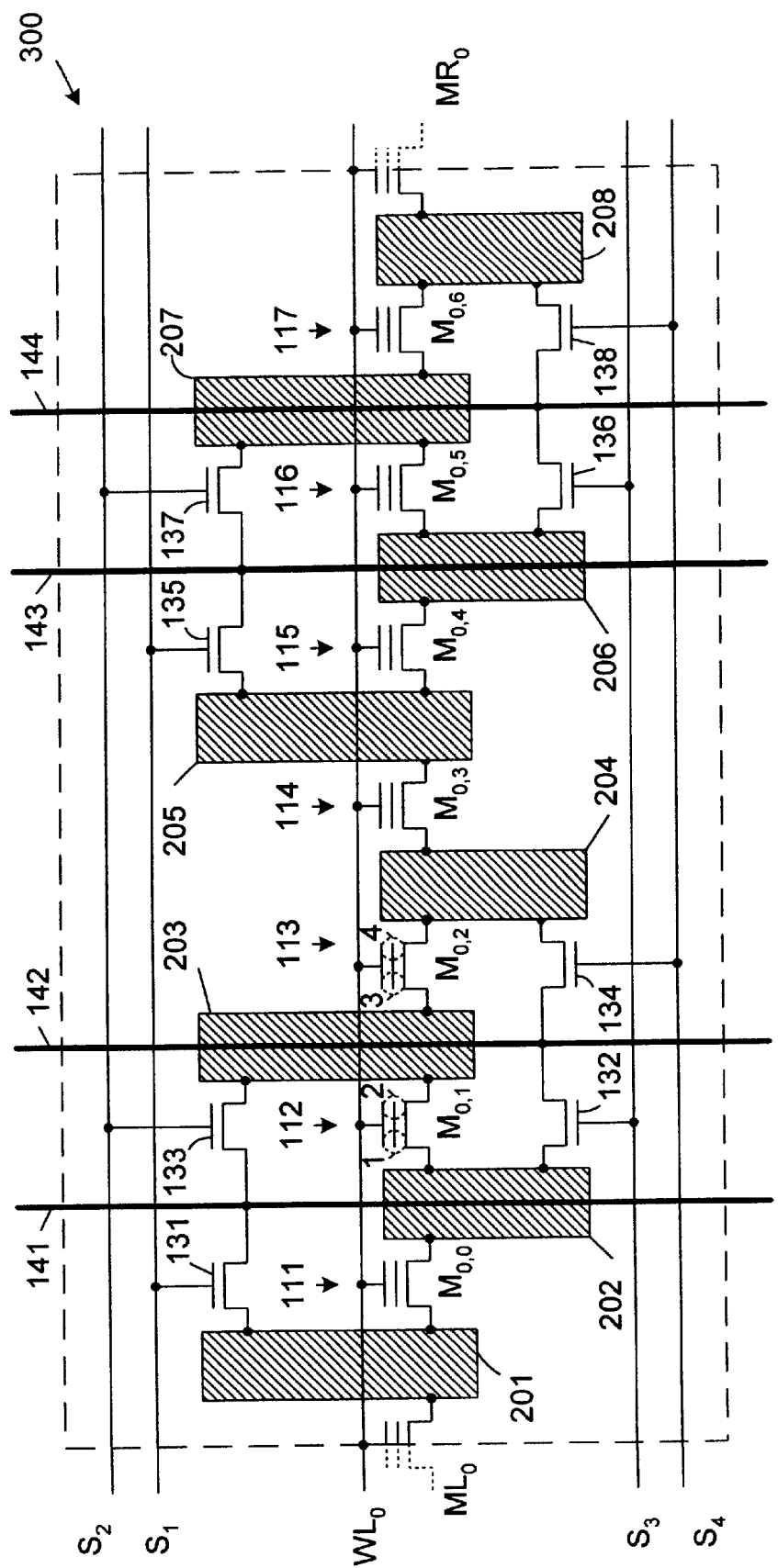
FIG. 8 is a schematic diagram of a memory block in accordance with another embodiment of the present invention.

FIG. 8 is a schematic diagram of a memory block 300 in accordance with another embodiment of the present invention. Because memory block 300 is similar to memory block 100 (FIG. 3), similar elements in FIGS. 3 and 8 are given similar reference numbers. Thus, memory block 300 includes memory cells $M_{0,0}$–$M_{0,6}$, shared memory cells $ML_0$ and $MR_0$, select transistors 131–138 and metal bit lines 141–144. Diffusion bit lines 101–108 of memory block 100 are replaced by diffusion bit lines 201–208 in memory block 300. As illustrated in FIG. 8, memory block 300 has only one row of memory cells, which includes memory cells $M_{0,0}$–$M_{0,6}$ and shared memory cells $ML_0$ and $MR_0$. As a result, the diffusion bit lines 201–208 of memory block 200 are much shorter along the second axis than the diffusion bit lines 101–108 of memory block 100. Select transistors 131–138 are connected to diffusion bit lines 201–208 in the same manner that select transistors 131–138 are connected to diffusion bit lines 101–108 in memory block 100 (FIG. 3). Similarly, select transistors 131–138 are connected to metal bit lines 141–144 and select lines S1–S4 in the manner previously described for memory block 100 (FIG. 3). A plurality of memory blocks identical to memory block 300 can be coupled together along the first and second axes, thereby forming a larger memory array.

Memory block 300 is controlled as follows. The memory cells of memory block 300 are programmed in the same manner as the memory cells of memory block 100. However, only the memory cells being programmed are exposed to the bit line programming voltages. As a result, there is less chance for disturb conditions to exist in non-selected memory cells during a programming operation in memory block 300. The memory cells of memory block 300 are read in the same manner as the memory cells of memory block 100.

In one embodiment, erase operations are carried out in memory block 300 in accordance with the following example. To erase the bit stored in the right charge trapping region 2 of memory cell $M_{0,1}$, the following steps are performed. First, the bit stored in the left charge trapping region 3 of the right-adjacent memory cell $M_{0,2}$ is read from memory block 300 and stored in a storage device. This storage device is similar to storage device 204 (FIG. 7), but has a depth of one word instead of 64 words. An erase operation is then performed to erase the bit stored in the right charge trapping region 2 of memory cell $M_{0,1}$. As described above, this erase operation also erases the bit stored in the left charge trapping region 3 of right-adjacent memory cell $M_{0,2}$. After the erase operation has been completed, the bit previously read from the left charge trapping region 3 of memory cell $M_{0,2}$ is written from the storage device back to the left charge trapping region 3 of memory cell $M_{0,2}$. The net result is that the right charge trapping region 2 of memory cell $M_{0,1}$ is erased. Although the present example is described in connection with a single bit in memory block 300, it is understood that another seven bits in similar memory blocks are controlled in the same manner in parallel, such that an 8-bit word is erased during an erase operation. Moreover, it is also understood that the left charge trapping region 3 of memory cell $M_{0,2}$ can be erased by reading the bit stored in the right charge trapping region 2 of memory cell $M_{0,1}$, performing the erase operation, and then restoring the bit to the right charge trapping region 2 of memory cell $M_{0,1}$.

As described above, the erase operation of memory block 300 is similar to the erase operation of memory block 100. However, memory block 300 will exhibit greater endurance than memory block 100, because on average, the memory cells of memory block 300 are programmed and erased twice as often as a comparable flash memory, rather than 63 times as often, as was the case for memory block 100. However, memory block 300 is less area efficient than memory block 100, because memory block 300 requires a full set of select transistors 131–138 for each row of memory cells.

In accordance with another embodiment of the invention, memory block 300 emulates an EEPROM by operating memory cells $M_{0,0}$–$M_{0,6}$, $ML_0$ and $MR_0$ as 1-bit memory cells. For example, in one embodiment, only the right charge trapping regions of memory cells $M_{0,0}$–$M_{0,6}$, $ML_0$ and $MR_0$ are used to store data. In this embodiment, the left charge trapping regions of these memory cells are not used to store data. Thus, erase operations are carried out simply by erasing the right charge trapping region of the desired memory cell. Even though the left charge trapping region of the right adjacent memory cell is incidentally erased, this is irrelevant because this left charge trapping region is not used to store data. Moreover, there is no detrimental over-erase condition associated with the left charge trapping region under these conditions. In this manner, memory block 300 can advantageously be operated as EEPROM in accordance with this embodiment. In a variation of this embodiment, only the left charge trapping regions are used to store data.

Although the invention has been described in connection with several embodiments, it is understood that this invention is not limited to the embodiments disclosed, but is capable of various modifications which would be apparent to a person skilled in the art. For example, although the memory blocks have been described as having eight diffusion bit lines, four metal bit lines and eight select transistors, it is understood that memory blocks having different numbers of diffusion bit lines, metal bit lines and select transistors can be constructed. Moreover, although memory blocks 100 and 300 have been described as having 32 rows of memory cells and one row of memory cells, respectively, it is understood that other numbers of memory cell rows can be used in other embodiments. In addition, although the charge trapping regions have been described in connection with an ONO structure, it is understood that these charge trapping regions can be implemented by other layers, such as a layer of silicon oxide having buried polysilicon islands. Moreover, elements other than the described select transistors can be used to provide access to the memory cells. Thus, the invention is limited only by the following claims.

What is claimed is:

1. A method for erasing a selected bit of a memory block, the method comprising the steps of:
   reading one or more bits from the memory block, wherein the one or more bits comprise all bits that are incidentally erased when the selected bit is erased;
   storing the one or more bits in a storage device;
   erasing the selected bit from the memory block; and then
   restoring the one or more bits from the storage device to the memory block.

2. The method of claim 1, wherein the step of reading one or more bits from the memory block comprises the step of reading a plurality of bits from adjacent columns of the memory block.

3. The method of claim 1, wherein the memory block comprises a plurality of columns of 2-bit non-volatile memory cells, each of the memory cells having a right charge trapping region for storing a bit and a left charge trapping region for storing a bit, wherein the step of reading one or more bits from the memory block further comprises the steps of:
   reading bits stored in the right charge trapping regions of a plurality of memory cells in a first column; and
   reading bits stored in the left charge trapping regions a plurality of memory cells in a second column, the second column being located immediately adjacent to the first column.

4. The method of claim 1, wherein the memory block comprises a plurality of columns of 2-bit non-volatile memory cells, each of the memory cells having a right charge trapping region for storing a bit and a left charge trapping region for storing a bit, wherein the selected bit is located in the right charge trapping region of a memory cell in a first column, and wherein the step of reading one or more bits from the memory block further comprises the step of reading a bit stored in the left charge trapping region of a memory cell in a second column, the second column being located immediately adjacent to the first column.

5. The method of claim 1, wherein the memory block comprises a plurality of rows of memory cells.

6. The method of claim 1, wherein the memory block comprises a single row of memory cells.

7. A method of implementing an electrically erasable programmable read only memory (EEPROM) array comprising the steps of:
   arranging a plurality of 2-bit non-volatile memory cells in a row, each of the memory cells having a first charge trapping region for storing a bit and a second charge trapping region for storing a bit, wherein each adjacent set of memory cells is coupled to share a common bit line; and
   storing data in only the first charge trapping region of each memory cell.

8. The method of claim 7, further comprising the step of simultaneously erasing a bit stored in the first charge trapping region of a first memory cell and a bit stored in the second charge trapping region of a second memory cell, wherein the first charge trapping region of the first memory cell and the second charge trapping region of the second memory cell are coupled to share a common bit line.

9. An electrically erasable programmable read only memory (EEPROM) circuit comprising:
   an array of 2-bit non-volatile memory cells arranged in a plurality of rows and columns, each of the memory cells having a first charge trapping region for storing a bit and a second charge trapping region for storing a bit, wherein adjacent memory cells in a row are coupled to share a common bit line;

a storage device coupled to the bit lines of the array; and a memory control circuit coupled to control the array and the storage device, wherein the memory control circuit erases a first bit from a first charge trapping region of a first memory cell by transferring one or more bits from the array to the storage device, the transferred bits being selected to include all bits that will be incidentally erased when the first bit is erased, erasing the first bit, and then restoring the transferred bits to the array.

10. The EEPROM array of claim 9, wherein the array comprises a plurality of memory blocks, each memory block including a plurality of rows and a plurality of columns of memory cells.

11. The EEPROM of claim 9, wherein the array comprises a plurality of memory blocks, each memory block including one row and a plurality of columns of memory cells.

12. The EEPROM of claim 9, wherein the first and second charge trapping regions are located in an oxidenitride-oxide (ONO) layer.

13. The EEPROM of claim 9, wherein the first and second charge trapping regions comprise a plurality of polysilicon islands buried in a silicon oxide layer.

14. The EEPROM of claim 9, wherein each of the bit lines comprises a diffused region in a semiconductor substrate.

* * * * *